(12) United States Patent
Yang et al.

(10) Patent No.: US 7,501,310 B2
(45) Date of Patent: Mar. 10, 2009

(54) STRUCTURE OF IMAGE SENSOR MODULE AND METHOD FOR MANUFACTURING OF WAFER LEVEL PACKAGE

(75) Inventors: Wen-Kun Yang, Hsin-Chu (TW);
Wen-Pin Yang, Hsinchu (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 0 days.

(21) Appl. No.: 11/945,723

(22) Filed: Nov. 27, 2007

(65) Prior Publication Data

US 2008/0108168 A1      May 8, 2008

Related U.S. Application Data

(63) Continuation of application No. 11/025,746, filed on Dec. 29, 2004, which is a continuation-in-part of application No. 10/833,345, filed on Apr. 28, 2004, now Pat. No. 7,061,106.

(51) Int. Cl.
*H01L 21/00* (2006.01)
(52) U.S. Cl. .................... 438/106; 438/110; 438/114
(58) Field of Classification Search ............... 438/106, 438/110, 114
See application file for complete search history.

(56) References Cited

U.S. PATENT DOCUMENTS

| | | | |
|---|---|---|---|
| 4,055,761 A | 10/1977 | Shimomura | 250/239 |
| 6,414,299 B1 | 7/2002 | Churei | 250/214.1 |
| 6,483,030 B1 | 11/2002 | Glenn et al. | 174/52.4 |
| 2003/0057359 A1 | 3/2003 | Webster | 205/216 |
| 2005/0184219 A1 | 8/2005 | Kirby | 250/208.1 |
| 2005/0236684 A1 | 10/2005 | Chen et al. | 257/433 |

*Primary Examiner*—Douglas M Menz
(74) *Attorney, Agent, or Firm*—Kusner & Jaffe

(57) ABSTRACT

An image sensor die comprises a substrate and an image sensor array formed over the substrate. Micro lens are disposed on the image sensor array. A protection layer is formed on the micro lens to prevent the micro lens from particle containment.

27 Claims, 6 Drawing Sheets

STRUCTURE OF IMAGE SENSOR MODULE AND METHOD FOR MANUFACTURING OF WAFER LEVEL PACKAGE

RELATED APPLICATIONS

The present invention is a continuation of co-pending U.S. patent application Ser. No. 11/025,746, entitled "Imagine Sensor with a Protection Layer," filed on Dec. 29, 2004, which is a continuation-in-part (CIP) application of U.S. patent application Ser. No. 10/833,345 (now U.S. Pat. No. 7,061,106), filed by the identical assignee of the present application, entitled "Structure of image sensor module and a method for manufacturing of wafer level package" filed on Apr. 28, 2004. The aforementioned patent applications are fully incorporated herein by reference.

BACKGROUND OF THE INVENTION

1. Field of the Invention

This invention relates to an image sensor, and more particularly to an image sensor structure free of particle contamination on micro lens, and the method for manufacturing the same.

2. Description of the Prior Art

The semiconductor technologies are developing very fast, and especially semiconductor dice have a tendency toward miniaturization. However, the requirements for the functions of the semiconductor dice have an opposite tendency to variety. Namely, the semiconductor dice must have more I/O pads into a smaller area, so the density of the pins is raised quickly. It causes the packaging for the semiconductor dice to become more difficult and decrease the yield. The main purpose of the package structure is to protect the dice from outside damages. Furthermore, the heat generated by the dice must be diffused efficiently through the package structure to ensure the operation the dice. Most of the package technologies divide dice on a wafer into respective dice and then to package and test the die respectively. Another package technology, called "Wafer Level Package (WLP)", can package the dice on a wafer before dividing the dice into respective dice. The WLP technology has some advantages, such as a shorter producing cycle time, lower cost, and no need to under-fill or molding.

A digital image technique has been wildly applied to image shooting instrument such as digital camera, image scanner, etc. The conventional CMOS sensor is disposed on a circuit board. The CMOS sensor has a chip secured therein. The lens seat has a focusing lens for focusing the image onto the chip of the CMOS sensor. Through the lens, the image signal is sent by the chip to a digital processor for converting the analog signal into digital signal. The Chip of the CMOS sensor is relatively sensitive to infrared ray and dust particles. If the unwanted particles are not removed from the sensor, it leads to downgrade the quality of the device. In order to achieve the purpose, the removal by manual may damage the sensitive chip. Typically, the image sensor module is formed by using a method of COB or LCC. One drawback of the COB is lower yield rate during packaging process due to particle contamination on sensing area. Besides, the drawbacks of the LCC are higher packaging cost and lower yield rate due to particle contamination on sensing area.

Further, micro lenses are optical components on semiconductors utilized as solid state imaging devices. One of the most important considerations in designing and manufacturing micro lenses is photosensitivity. One reason micro lens photosensitivity may be reduced is that the area of each micro lens has been reduced below an optimum value. Moreover, SHELL CASE company also develops wafer level package technique, the image sensor dice packaged by the SHELL CASE is higher cost due to requiring two glass plate and complicate process. And, the transparency is bad due to epoxy wearing out, and the potential reliability may be reduced. U.S. Pat. No. 5,514,888 for ON-CHIP SCREEN TYPE SOLID STATE IMAGE SENSOR AND MANUFACTURING METHOD THEREOF; issued May 7, 1996 to Yoshikazu Sano, et al. teaches a method for forming charge-coupled devices (CCDS) on a silicon substrate. A micro lens array is formed over the CCD array using conventional lithography and re-flow techniques.

Therefore, what is desired is to provide a novel image sensor structure free of particle contamination on sensing area.

SUMMARY OF THE INVENTION

Therefore, the present invention has been made in view of the above problems in the prior arts, and it is an objective of the present invention to provide an image sensor die structure without particle contamination on micro lens and method for manufacturing the same.

An image sensor die comprises a substrate and an image sensor array formed over the substrate. Micro lens are disposed on the image sensor array. A protection layer having character of water repellency and/or oil repellency is formed on the micro lens to prevent the micro lens from particle containment. The protection layer is preferably a low refractive index layer. The protection layer includes PMMA (Polymethylmethacrylat), SOG (Spin on Glass), PolyCarbonate, Fluoropolymer, $SiO_2$, $Al_2O_3$. The image sensor array includes CMOS or CCD. The image sensor die further comprises a filtering layer formed on the protection layer. The image sensor die further comprises a color filter formed over the image sensor array.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims. Then, the components of the different elements are not shown to scale. Some dimensions of the related components are exaggerated and meaningless portions are not drawn to provide a more clear description and comprehension of the present invention.

Figure 1:
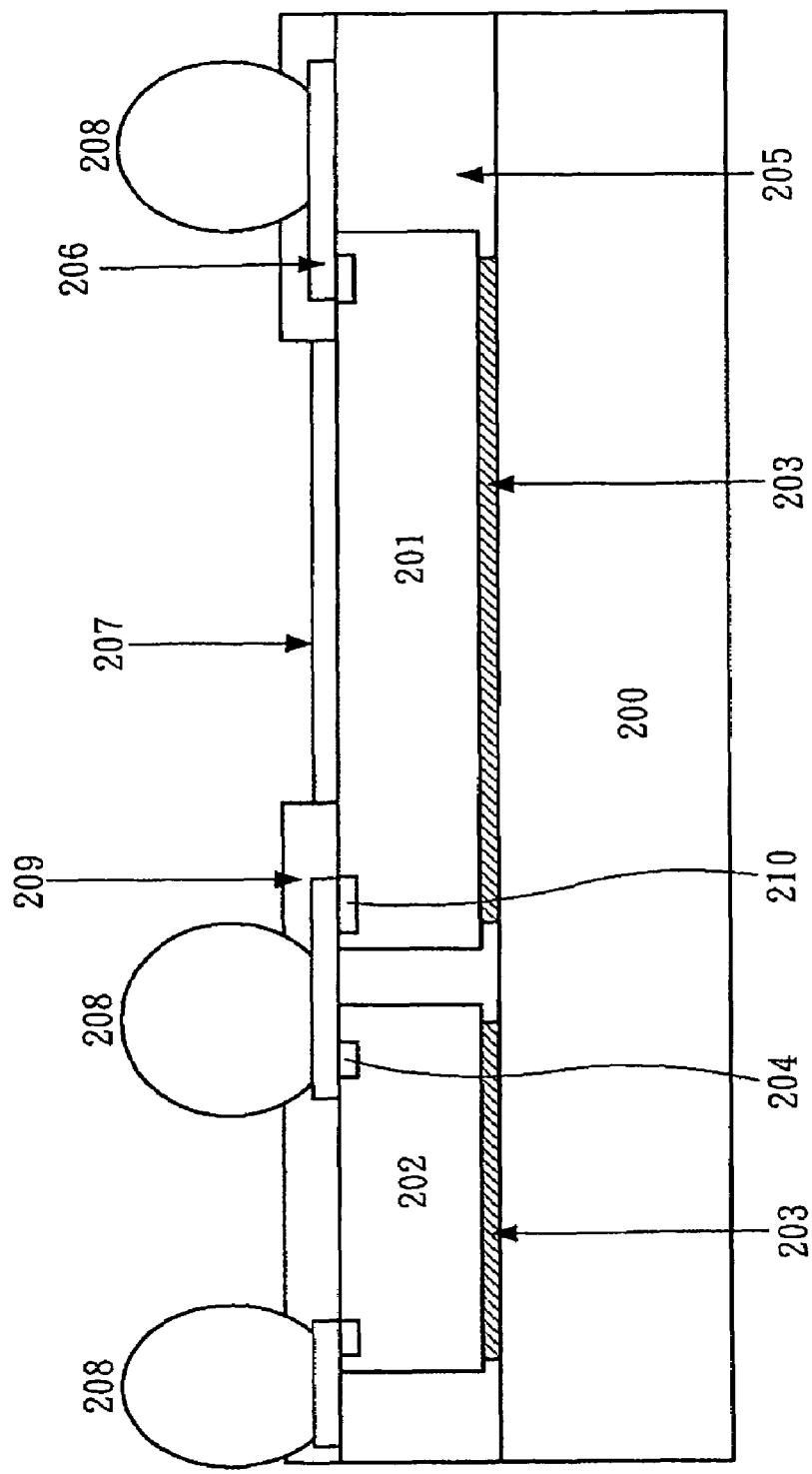
FIG. 1 is a schematic diagram of a package with a side by side structure according to the present invention.

A wafer level package structure is provided, as shown in FIG. 1. The package structure comprises an isolating base 200, image sensor dice 201 and dice 202, a first dielectric layer 205, a second dielectric layer 207, contact conductive layer 206, an isolation layer 209 and solder balls 208. The material of the isolating base 200 can be glass, silicon, ceramic or quartz crystal etc., and even have a round or a rectangular shape. The image sensor dice 201 and the dice 202 are packaged with a side by side structure. The image sensor dice 201 and the dice 202 are adhered to the isolating base 200 by an UV curing type and/or heat curing type adhesion material 203 with good thermal conductivity. The first dielectric layer 205 is formed on the isolating base 200 and filled in a space except the image sensor dice 201 and the dice 202 on the isolating base 200. The material of the first dielectric layer 205 may be silicon rubber.

The second dielectric layer 207 is formed on the image sensor dice 201 to cover a sensing area of the image sensor dice 201. The material of the second dielectric layer 207 is $SiO_2$ to be a protection film. Besides, a filtering film may be formed on the second dielectric layer 207, and the filtering film is, for example IR filtering layer, to be a filter.

The contact conductive layer 206 is formed on metal pads 210 of the image sensor dice 201 and metal pads 204 of the dice 202 to cover the metal pads 210,204. Namely, the contact conductive layer 206 may be electrically coupled to the metal pads 210,204, respectively. The material of the contact conductive layer 206 may be selected from Ni, Cu, Au and the combination thereof. The metal pads 210,204 are, for example Al pads. The isolation layer 209 is formed on the contact conductive layer 206, and the isolation layer 209 has openings on the contact conductive layer 206. The material of the isolation layer 209 is selected from epoxy, resin, SINR (Siloxane polymer)_or_BCB. The metal soldering balls 208 are formed on the openings by welding method so that the metal soldering balls 208 are electrically coupled with the contact conductive layer 206, respectively. The metal soldering balls 208 may be solder balls 208.

The dice 202 may be selected from DSP die, active die, passive die, support die, CPU die or processor die, and the image sensor dice 201 are CMOS image sensor dice. The image sensor dice 201 are packaged with the dice 202 with a side by side structure.

Figure 2:
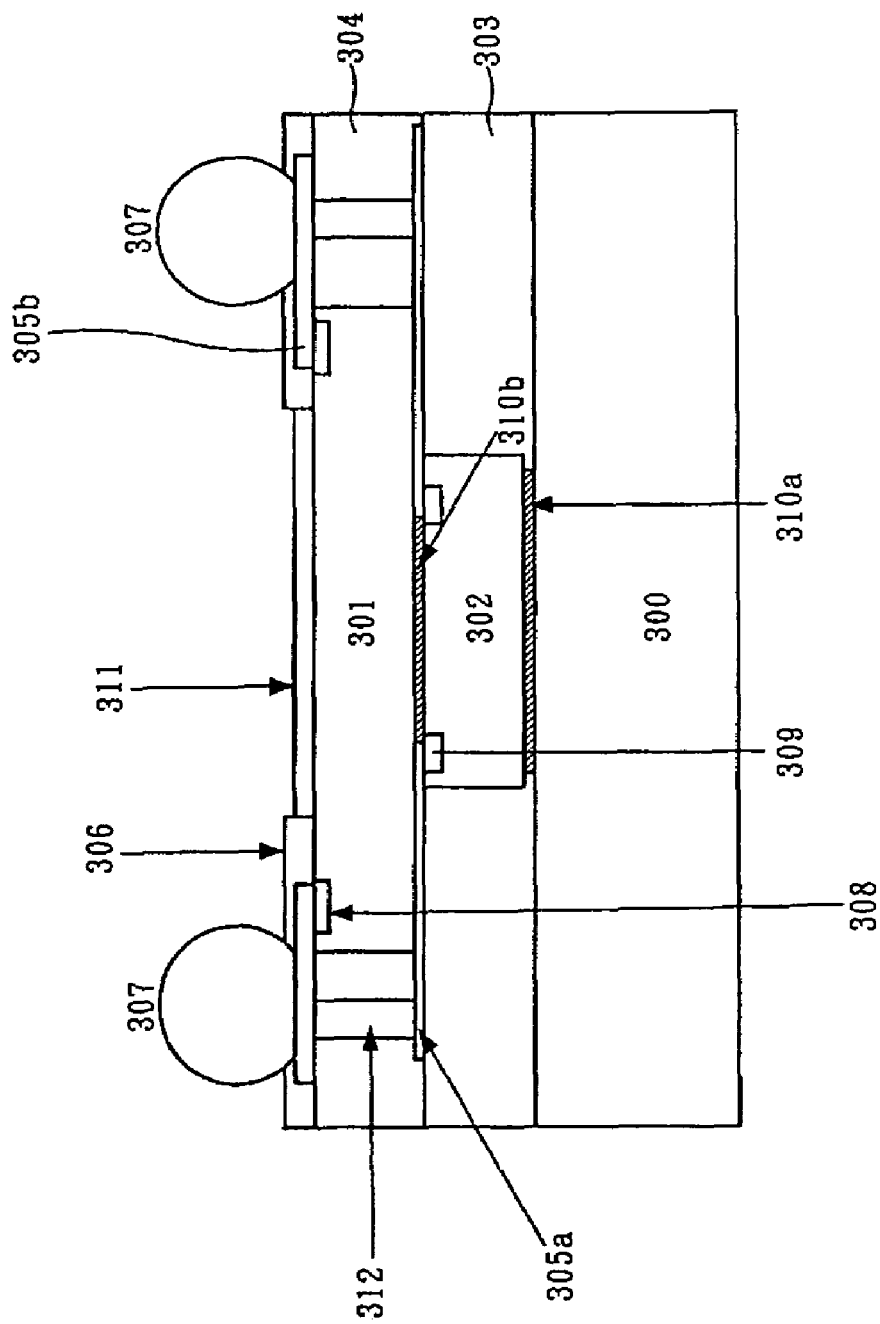
FIG. 2 is a schematic diagram of a package with a stacking structure according to the present invention.

Moreover, another wafer level package structure is provided, as shown in FIG. 2. The dice, in one embodiment, are packaged with a stacking structure. The package structure comprises an isolating base 300, image sensor dice 301 and dice 302, a first dielectric layer 303, a second dielectric layer 304, a third dielectric layer 311, contact conductive layer 305a, 305b, an isolation layer 306 and solder balls 307. The material of the isolating base 300 is glass, silicon, ceramic or quartz crystal etc., and even has a round or a rectangular shape. The image sensor dice 301 and the dice 302 are packaged with a stacking structure. The dice 302 are adhered to the isolating base 300 by an UV curing type and/or heat curing type adhesion material 310a with good thermal conductivity. The first dielectric layer 303 is formed on the isolating base 300 and filled in a space except the dice 302 on the isolating base 300. The material of the first dielectric layer 303 may be silicon rubber.

The contact conductive layer 305a is formed on metal pads 309 of the dice 302 to cover the metal pads 309 to electrically couple to the metal pads 309, respectively. The image sensor dice 301 are adhered to the dice 302 by an UV curing type and/or heat curing type adhesion material 310b with good thermal conductivity. The second dielectric layer 304 is formed on the first dielectric layer 303 and filled in a space except the image sensor dice 301, and the second dielectric layer 304 has via hole 312 formed on the contact conductive layer 305a. The material of the second dielectric layer 304 is $SiO_2$.

Besides, the third dielectric layer 311 is formed on the image sensor dice 301 to cover a sensing area of the image sensor dice 301. However, the third dielectric layer 311 should not affect function of the image sensor dice 301. The material of the third dielectric layer 311 is $SiO_2$ to be a protection film. Specially, a filtering film may be formed on the third dielectric layer 311 on the image sensor dice 301, and the filtering film is, for example IR filtering layer, to be a filter.

The contact conductive layer 305b is formed on metal pads 308 of the image sensor dice 301 and filled in the via hole 312 to cover the metal pads 308. Namely, the contact conductive layer 305b is electrically coupled to the metal pads 308 and the contact conductive layer 305a. The material of the contact conductive layer 305a, 305b may be selected from Ni, Cu, Au and the combination thereof. The metal pads 308, 309 are, for example Al pads. The isolation layer 306 is formed on the contact conductive layer 305b, and the isolation layer 306 has openings on the contact conductive layer 305b. The material of the isolation layer 306 is selected from epoxy, resin and the combination thereof.

The metal soldering balls 307 are formed on the openings by welding method so that the metal soldering balls 307 are electrically coupled with the contact conductive layer 305b, respectively. The metal soldering balls 307 may be solder balls 307.

The dice 302 may be selected from DSP die, active die, passive die, support die, CPU die or processor die, and the image sensor dice 301 are CMOS image sensor dice. The image sensor dice 301 are packaged with the dice 302 with a stacking structure.

Figure 3:
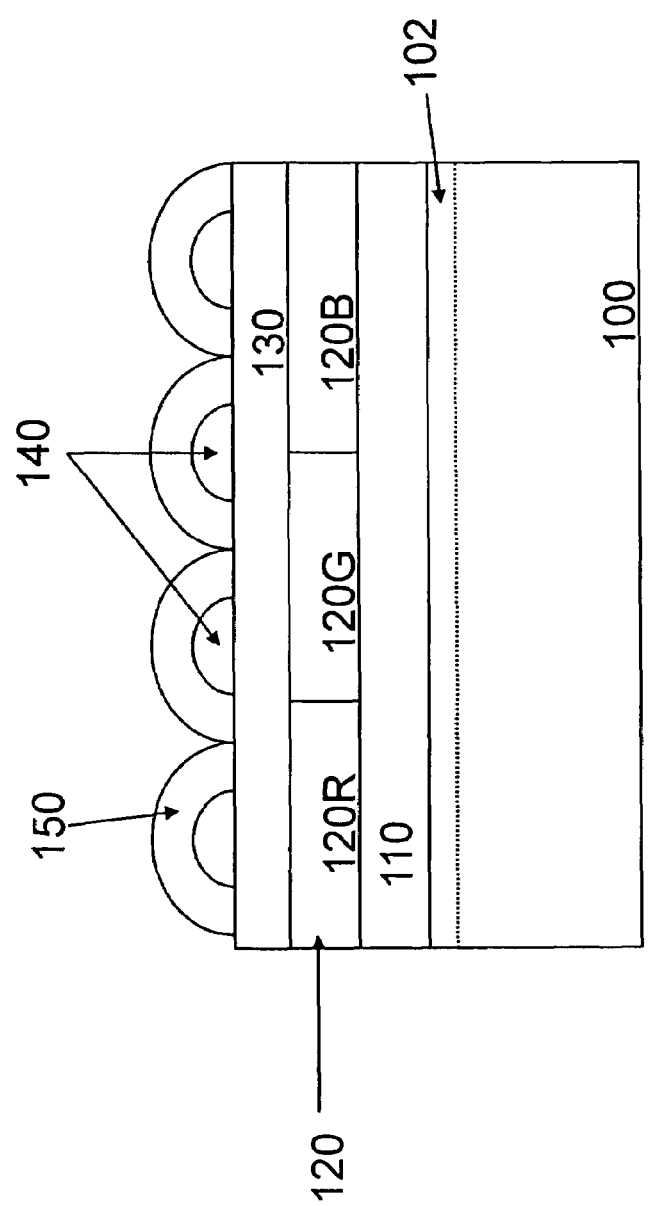
FIG. 3 is a schematic diagram of an image sensor die according to the present invention.

Referring to FIG. 3, micro lens arrays 140 are generally formed on the top surfaces of silicon chips. The substrate 100 bears a plurality of CMOS devices in sensing area 102. The image sensor includes an isolation layer 110 formed over a substrate 100. A color filter layer 120 is next formed over the isolation layer 100 with sub-pixel areas properly aligned with active devices in the substrate 100. Another layer 130 is generally formed over the color filter layer 120. There are several ways well known to those skilled in the art to proceed with the formation of a micro lens array. The layer of lens forming material 140 is applied to the substrate. One material found suitable for this application is a mixture of melamine resin and generic novolac base resin. Individual lens areas are formed in the lens material layer 140 by masked exposure and developing. For example, a photo resist (PR; not shown) is deposited over the lens material layer 140. Conventional lithographic techniques are then utilized to form patterns in the PR by using exposure and development step. PR is then stripped. The devices are hard baked to re-flow the micro lenses 140 into the proper optical form by controlling time and temperature. Individual Red/Green/Blue (RGB) sub-pixel areas 120R, 120G, 120B, respectively, are shown aligned over corresponding CMOS devices in substrate 100 as known in the art.

Figure 4:
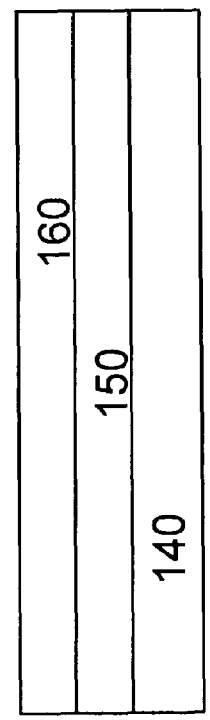
FIG. 4 is a schematic diagram of a protection layer on the micro lens according to the present invention.

The present invention provides an image sensor device as shown in FIG. 3. The material of the substrate 100 can be glass, semiconductor material, ceramic or quartz etc. Moreover, a protection layer 150 can be covered on the micro lenses 140. The material of the protection layer 150 includes $SiO_2$ or $Al_2O_3$ formed by spin coating. Further, the material for the protection layer 150 could be PMMA (Polymethylmethacrylat), SOG (Spin on Glass), PolyCarbonate or Fluoropolymer. The thickness of the protection layer 150 is controlled less than 0.5 micron meters (μm) so that it will not affect the function of the CMOS sensor. Alternatively, the protection layer 150 may comprise a filtering layer 160, for example IR filtering layer, formed on the protection layer 150 to act as a filter, as show in FIG. 4. The protection layer 150 may prevent the micro lens from particle containment. The user may use liquid or air flush to remove the particles on the protection layer 150 without damaging the micron lens. The protection layer is a water repellency and/or oil repellency. Preferably, the protection layer is a low refractive index layer.

An isolation layer (not shown) is formed over the substrate 100 and it has openings to not cover the image sensor area for conveniently sensing the image. The material of the isolation layer is selected from epoxy, resin and the combination thereof.

FIG. 5A to FIG. 5J are schematic diagrams of a method for manufacturing of wafer level package according to the present invention.

Figure 5A:
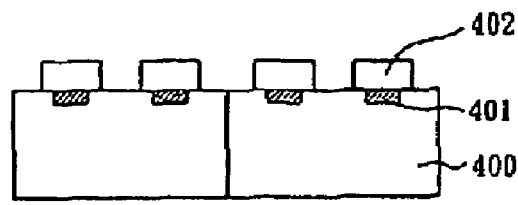
FIG. 5A to FIG. 5J are schematic diagrams of a method for manufacturing of wafer level package according to the present invention.
Figure 5B:
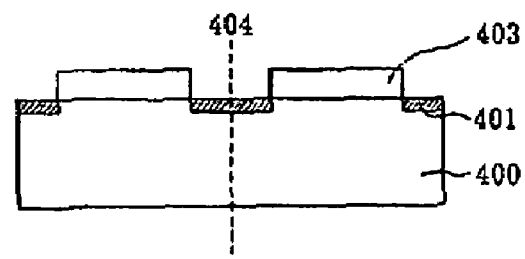

Moreover, the present invention provides a process of wafer level package. First, a first photo resist pattern 402 is formed on metal pads 401 of a plurality of dies 400 on a wafer to cover the metal pads 401, as shown in FIG. 5A. A first dielectric layer is formed on the first photo resist pattern 402 and the dies 400. Then, the first dielectric layer is cured. The first photo resist pattern 402 is removed to form a dielectric layer 403. The material of the dielectric layer 403 is $SiO_2$ by spin coating method to be a protection film. The plurality of dies 400 on the wafer is sawed along the sawing line 404 to form individual dies, as shown in FIG. 5B. Specially, a filtering film may be formed on the dielectric layer 403, and the filtering film is, for example IR filtering layer, to be a filter, as referring to above embodiment.

A step of back lapping the processed silicon wafer is used to get a thickness of the wafer around 100-300 μm after the step of removing first photo resist pattern 402. The processed silicon wafer with the aforementioned thickness is easily sawed to divide the dies 400 on the wafer into respective dies. The back lapping step may be omitted if the processed silicon wafer is not hard to saw without back lapping. The dies 400 comprise at least two types of dies.

Figure 5C:
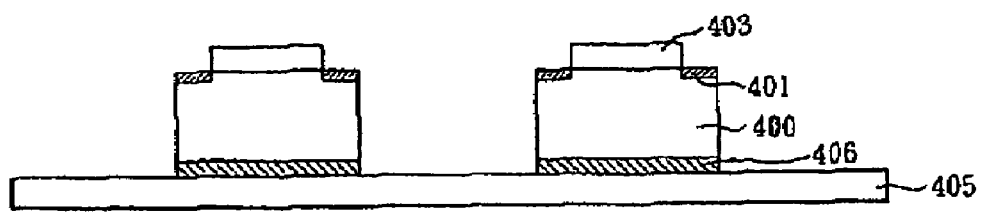

Next, the divided dies are tested to choose standard good dies 400 there from. The standard good dies 400 are picked and replaced onto an isolating base 405 with a wider distance between two adjacent dies and adhered to the isolating base 405 with an UV curing type and/or heat curing type adhesion material 406 with good thermal conductivity. The isolating base 405 is cured by UV light or thermal, as shown in FIG. 5C. The adhesion material 406 is coating on the isolating base 405, and the thickness of the adhesion material 406 is preferably 20-60 μm. The material of the isolating base 405 can be glass, silicon, ceramic, crystal materials etc., and even have a round or a rectangular shape.

The dies 400 have I/O pads 401 on the upper surface. The adhesive material 406 of the present invention is preferably good thermal conductive material, so the problems (such as stress) resulted from the temperature difference between the dies 400 and the isolating base 405 can be avoided.

Figure 5D:
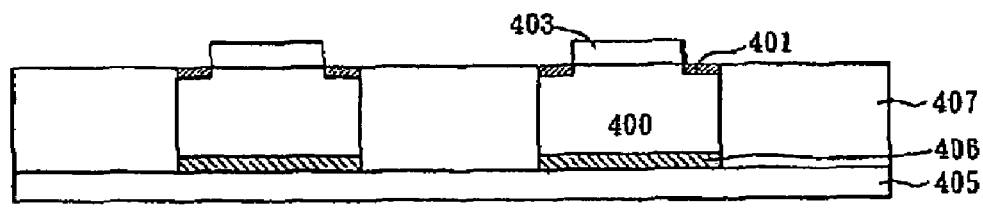

A material layer 407 is formed on the isolating base 405 to fill in the space among the die 400 and adjacent dies 400, and the surface of the material layer 407 and the surface of the die 400 are at same level, as shown in FIG. 5D. The material of the material layer 407 can be UV curing type or heating curing type material. Then, the material layer 407 is cured by UV or thermal. The material layer 407 may be formed by a screen printing method or a photolithography method. The material layer 407 functions as a buffer layer to reduce a stress due to temperature, etc. The material layer 407 can be an UV and/or heat curing material, such as silicon rubber, epoxy, resin, BCB, and so on.

A second dielectric layer is coated on the material layer 407 and metal pads 401. The material of the second dielectric layer can be $SiO2$.

Figure 5E:
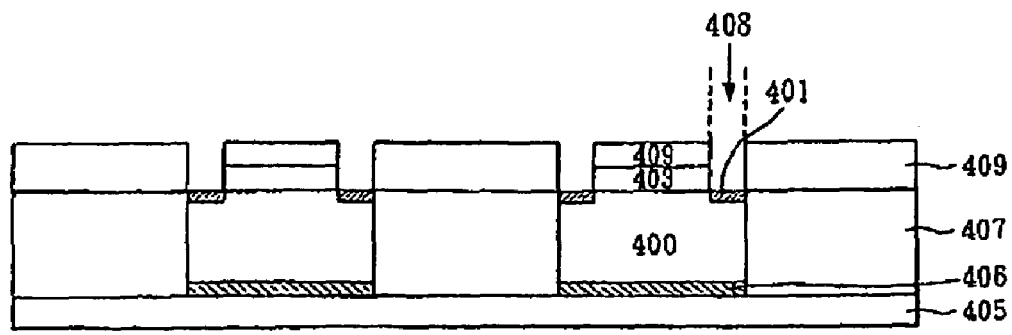

Then, the partial area of the second dielectric layer on the metal pads 401 is removed by using a photo mask to form first openings 408 on the metal pads 401, and then the dielectric layer 409 is cured by UV or heating, as shown in FIG. 5E. Next, the plasma etching (RIE) can be used optionally to clean the surface of the metal pads 401 to make sure no residual materials on the metal pads 401.

Figure 5F:
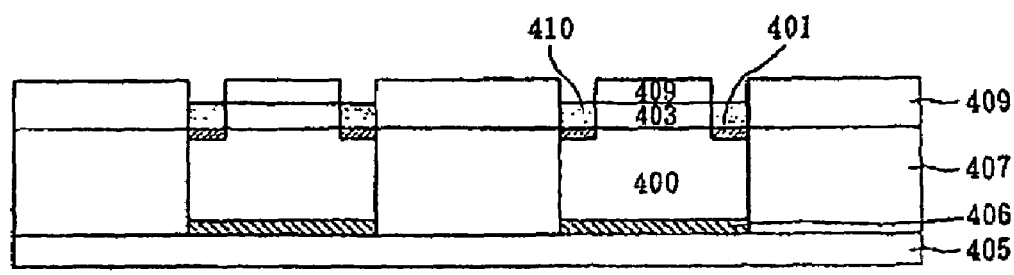

The contact conductive layer 410 is formed on the first openings 408 to electrically couple with the metal pads 401 respectively, as shown in FIG. 5F. The preferable material of the contact conductive layer 410 is Ti, Cu, or the combination thereof. The contact conductive layer 410 can be formed by a physical method, a chemical method, or the combination thereof, for example: CVD, PVD, sputter, and electroplating.

Figure 5G:
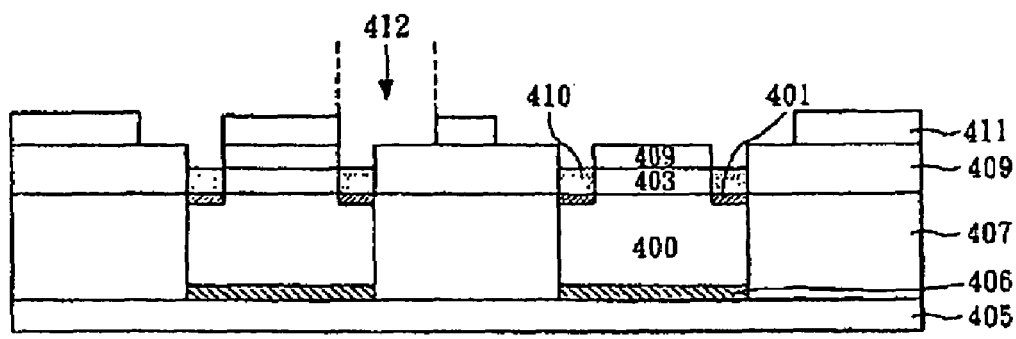

A second photo resist layer is formed on the dielectric layer 409 and the contact conductive layer 410. And then, a partial region of the second photo resist layer is exposed and developed by using a photo mask to form a second photo resist pattern 411 and expose the contact conductive layer 410 to form second openings 412, as shown in FIG. 5G.

Figure 5H:
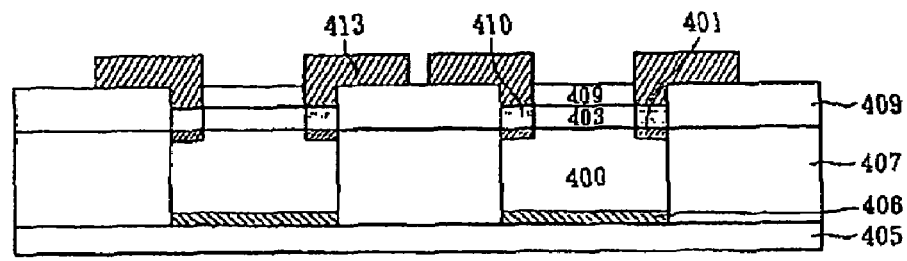

Then, conductive lines 413 by electroplating method are formed on the second openings 412 to couple with the contact conductive layer 413 respectively, as shown in FIG. 5H. The material of the conductive lines 413 are preferably Cu, Ni, Au, or the combination thereof. The conductive lines 413 are called re-distribution layer (RDL).

Figure 5I:
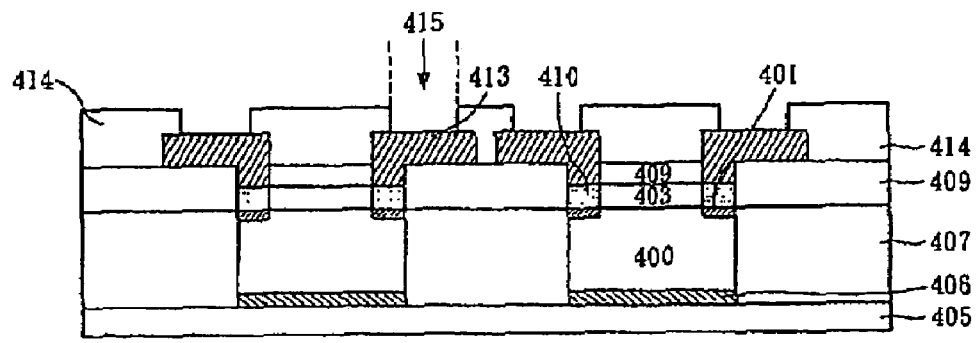

The remaining second photo resist layer 411 is removed. An isolation layer is formed on the conductive lines 413 and the dielectric layer 409. A partial region of the isolation layer is removed to form a isolation layer 414 and third openings 415 on the conductive lines 413, as shown in FIG. 5I. The isolation layer can be formed by a spin coating method or a screen printing method.

The present invention may optionally comprise a step of forming an epoxy layer (not shown) on back surface of the isolating base 405.

Figure 5J:
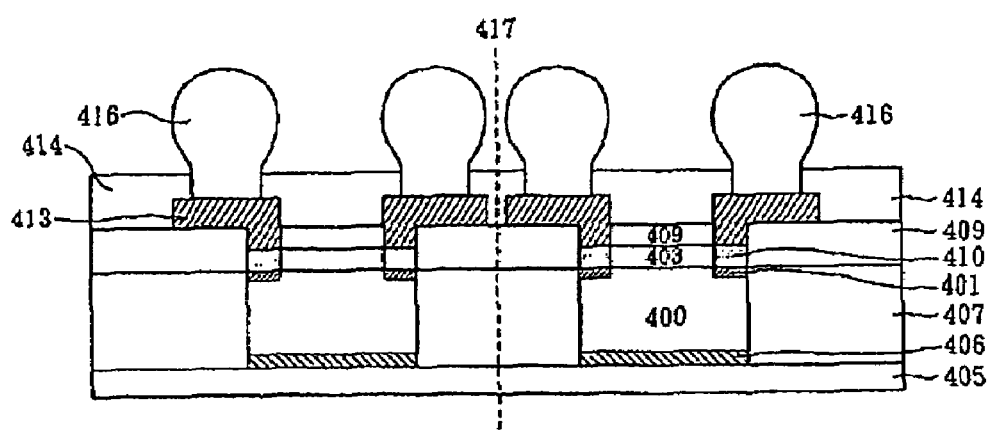

The isolation layer 414 is cured. Solder balls 416 are formed on the third openings 415, as shown in FIG. 5J. The solder balls 416 may be placed on the third openings 415 by a screen printing method and the solder balls 416 joined together with surfaces of the conductive lines 413 by an IR reflow method.

Finally, the isolating base 405 is sawed along the sawing line 417 to separate individual IC package.

Although specific embodiments have been illustrated and described, it will be obvious to those skilled in the art that various modifications may be made without departing from what is intended to be limited solely by the appended claims.

Having described the invention, the following is claimed:

1. A process of wafer level package, comprising the steps of:
   forming a first photo resist pattern on metal pads of a plurality of dies on a wafer to cover said metal pads;
   forming a first dielectric layer on said first photo resist pattern and said
   plurality of dies; curing said first dielectric layer;
   removing said first photo resist pattern;
   sawing said plurality of dies on said wafer to form individual dies;
   selecting good said dies and attaching said good dies to an isolating base;

curing said isolating base;
forming a material layer on said isolating base to fill in a space among said plurality of dies on said isolating base;
curing said material layer;
forming a second dielectric layer on said material layer and said metal pads;
etching a partial region of said second dielectric layer on said metal pads to form first openings on said metal pads;
curing said second dielectric layer; forming a contact conductive layer on said first openings to electrically couple with said metal pads, respectively;
forming a second photo resist layer on said second dielectric layer and said contact conductive layer;
removing a partial region of said second photo resist layer to form a second photo resist pattern and expose said contact conductive layer to form second openings;
forming conductive lines on said second photo resist pattern and said second openings being coupled with said contact conductive layer, respectively;
removing remaining said second photo resist layer;
forming an isolation layer on said conductive lines and said second dielectric layer;
removing a partial region of said isolation layer on said conductive lines to form third openings;
curing said isolation layer; and
welding solder balls on said third openings.

2. The process in claim 1, further comprising a step of sawing said isolating base to isolate said plurality of dies after the step of said welding solder balls.

3. The process in claim 1, further comprising a step of back lapping said wafer to get a thickness of said wafer around 100-300 μm after the step of said removing first photo resist pattern.

4. The process in claim 1, further comprising a step of forming an epoxy layer on back surface of said isolating base.

5. The process in claim 1, wherein said plurality of dies comprise at least two types of dies.

6. The process in claim 1, wherein material of said first dielectric layer is $SiO_2$ by spin coating.

7. The process in claim 1, wherein material of said isolating base is glass, silicon, ceramic or quartz crystal.

8. The process in claim 1, wherein material of said material layer is silicon rubber, epoxy, BCB, BT, polyimide (PI) or SINR(Siloxane polymer).

9. The process in claim 1, wherein material of said second dielectric layer is silicon rubber, epoxy, SINR(Siloxane polymer), BCB or polyimide (PI).

10. The process in claim 1, further comprising a step of forming a filtering film on said first dielectric layer, said filtering film is an IR filtering layer.

11. The process in claim 1, wherein material of said contact conductive layer is selected from Ti, Cu and the combination thereof.

12. The process in claim 1, wherein material of said isolation layer is selected from epoxy, resin and the combination thereof.

13. The process in claim 1, wherein material of said conductive lines is selected from Ni, Cu, Au and the combination thereof.

14. The process in claim 1, wherein said step of welding said solder balls comprises placing said solder balls on said third openings by a screen printing method and joining said solder balls together with surfaces of said conductive lines by an IR reflow method.

15. A process of wafer level package, comprising the steps of:
forming a first dielectric layer on a plurality of dies on a wafer by using a first photo resist pattern;
sawing said plurality of dies on said wafer to form individual dies;
selecting good said dies and attaching said good dies to a isolating base;
forming a material layer on said isolating base to fill in a space among said plurality of dies;
forming a second dielectric layer on said material layer;
etching a partial region of said second dielectric layer to form first openings to expose metal pads on said dies;
forming a contact conductive layer on said first openings to electrically couple with said metal pads, respectively;
forming a second photo resist pattern to expose said contact conductive layer to form second openings;
forming conductive lines on said second photo resist pattern and said second openings being coupled with said contact conductive layer, respectively;
removing remaining said second photo resist pattern;
forming an isolation layer on said conductive lines and said second dielectric layer;
removing a partial region of said isolation layer on said conductive lines to form third openings; and
welding solder balls on said third openings.

16. The process in claim 15, further comprising a step of sawing said isolating base to isolate said plurality of dies after the step of said welding solder balls.

17. The process in claim 15, further comprising a step of back lapping said wafer to get a thickness of said wafer around 100-300 μm after the step of said removing said first photo resist pattern.

18. The process in claim 15, further comprising a step of forming an epoxy layer on back surface of said isolating base.

19. The process in claim 15, wherein said plurality of dies comprise at least two types of dies.

20. The process in claim 15, wherein material of said first dielectric layer is $SiO_2$ by spin coating.

21. The process in claim 15, wherein material of said isolating base is glass, silicon, ceramic or quartz crystal.

22. The process in claim 15, wherein material of said material layer is silicon rubber, epoxy, resin, BCB, BT, polyimide (PI) or SINR(Siloxane polymer).

23. The process in claim 15, wherein material of said second dielectric layer is SINR(Siloxane polymer), BCB or polyimide (PI).

24. The process in claim 15, further comprising a step of forming a filtering film on said first dielectric layer, said filtering film is an IR filtering layer.

25. The process in claim 15, wherein material of said contact conductive layer is selected from Ti, Cu and the combination thereof.

26. The process in claim 15, wherein material of said isolation layer is selected from epoxy, resin and the combination thereof.

27. The process in claim 15, wherein material of said conductive lines is selected from Ni, Cu, Au and the combination thereof.

* * * * *